(12) United States Patent
Buffet et al.

(10) Patent No.: US 6,477,057 B1
(45) Date of Patent: Nov. 5, 2002

(54) HIGH FREQUENCY DE-COUPLING VIA SHORT CIRCUITS

(75) Inventors: Patrick H. Buffet, Essex Junction, VT (US); Paul Lee Clouser, Shelburne, VT (US); Danny Marvin Neal, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/640,538

(22) Filed: Aug. 17, 2000

(51) Int. Cl.$^7$ ................................................. H05K 7/02
(52) U.S. Cl. ...................... 361/780; 361/720; 361/760; 361/794; 361/748
(58) Field of Search ................................ 361/780, 763, 361/794, 502, 720, 760, 734, 748

(56) References Cited

U.S. PATENT DOCUMENTS 5,012,047 A  *  4/1991  Dohya .......................... 174/34
6,040,985 A  *  3/2000  Arai et al. .................... 361/780
6,084,779 A  *  7/2000  Fang ............................ 361/763

* cited by examiner

Primary Examiner—David Martin
Assistant Examiner—Hung Bui
(74) Attorney, Agent, or Firm—Robert V. Wilder; Mark E. McBurney

(57) ABSTRACT

A method and implementing computer system are provided in which de-coupling capacitors are used at driver and receiver sources, and defined gaps are created separating power and ground areas on a voltage reference plane of a circuit board. Short-circuit via connections are also provided through one or more vias between spatially separated circuit board layers. Each driver or receiver module includes the driver or receiver along with an associated gap, capacitor and via connections to VDD and ground planes, all included within a defined proximity to effectively block switching energy and/or VDD noise from entering the tri-plate ground-to-ground reference system. In a related exemplary construction, signal lines are placed at predetermined positions between ground planes to provide a tri-plate circuit board structure for transmitting logic signals from a driver to one or more receivers.

11 Claims, 2 Drawing Sheets

HIGH FREQUENCY DE-COUPLING VIA SHORT CIRCUITS

FIELD OF THE INVENTION

The present invention relates generally to information processing systems and more particularly to a methodology and implementation for signal transmission in digital electronic systems.

RELATED APPLICATIONS

Subject matter disclosed and not claimed herein is disclosed and claimed in one or more of the following related copending applications, which are assigned to the assignee of the present application and included herein by reference:

Ser. No. 09/640,544;
Ser. No. 09/640,539; and
Ser. No. 09/640,512.

BACKGROUND OF THE INVENTION

In digital computer assemblies, including integrated circuit packaging, printed circuit cards or boards, and system backplanes, it has become common practice over the years to sandwich a logic signal (SIG) transmission line between two reference planes, i.e. between a power (VDD) reference plane and a power return ground (GND) reference plane, while transmitting the logic signal from a driver circuit to one or more receiver circuits. That practice alone would create a very undesirable VDD-to-GND AC switching energy storage and transmission system problem between the two reference planes. In order to minimize that problem, many de-coupling capacitors have been coupled between the two planes. The de-coupling capacitors are effective to AC-short-circuit the two reference planes together. Such de-coupling capacitors are connected to each plane by vias to form a three part series combination of via-component-via. Thus there is formed a signal transmission system which also doubles as a DC power (VDD) and DC power ground (GND) return since the reference planes are DC-isolated but AC-short-circuited. In this manner power, power, return and logic signals may be efficiently packaged with the fewest number of conducting layers. However, switching energy and reference potential noise continue to be a problem especially as system switching frequencies continue to increase.

Thus there is a need for an improved methodology and implementing system which provides for improved signal transmission in a digital signal processing system while blocking switching energy and reference potential noise from entering the system reference potential distribution architecture.

SUMMARY OF THE INVENTION

A method and implementing computer system are provided in which continuous reference potential planes are connected together by direct short-circuit connections. In an exemplary embodiment, de-coupling capacitors are eliminated and short-circuit connections are provided through the use of vias connecting reference potential planes together and transmitting logic signals from a driver to one or more receivers between two potential reference planes. In one exemplary embodiment, power (VDD) planes are connected together with vias through a circuit board construction and in a second exemplary embodiment ground (GND) planes are similarly connected together.

BRIEF DESCRIPTION OF THE DRAWINGS

A better understanding of the present invention can be obtained when the following detailed description is considered in conjunction with the following drawings, in which.

DETAILED DESCRIPTION

The various methods discussed herein may be implemented within a computer system circuit board voltage distribution system as shown in the disclosed example although the teachings of the present invention are also applicable to voltage distribution systems in other electronic systems and sub-systems as well.

Figure 1:
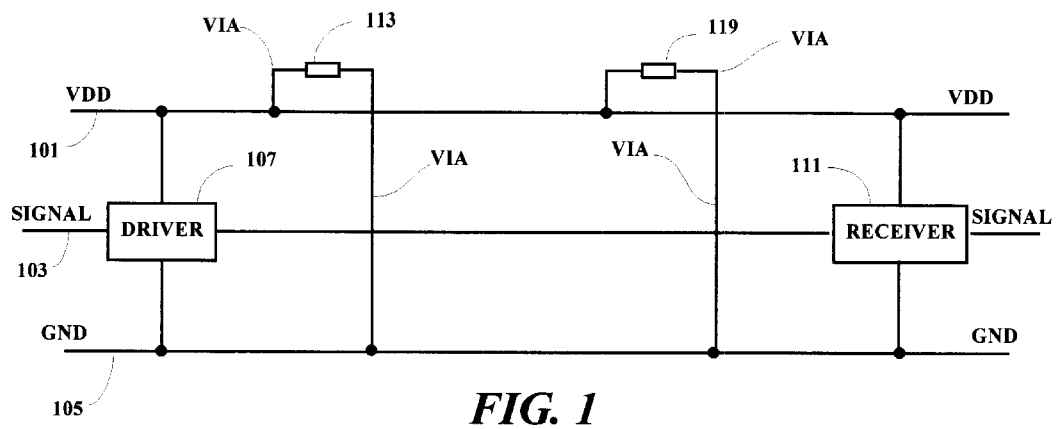
FIG. 1 is a schematic diagram of a prior art circuit board signal transmission system.

As shown in FIG. 1, a typical prior art circuit board arrangement includes a power plane 101 which may be comprised of a metal layer within a circuit board. The power plane or layer 101 is maintained at a reference VDD power potential. Also shown is a signal layer or plane 103 for transmitting signals, and a ground (GND) layer or plane 105 which is connected to a ground reference potential. Signals are transmitted during signal processing operations through signal conductors along the signal plane 103 between a driver circuit 107 and a receiver circuit 111. Also, de-coupling capacitors 113 and 119 are shown connected between the power plane 101 and the GND plane 105 through board vias. In FIG. 1, the de-coupling capacitors 113 and 119 are not associated with either the driver 107 or the receiver 111 but are rather placed between the power plane and the ground plane to accomplish the desired AC short-circuit coupling.

The de-coupling capacitors 113 and 119 are connected to each plane 101 and 105 and together with the connecting vias, form a three part series combination of via-component-via. The combination of elements in FIG. 1 forms a signal transmission system which also acts as a DC power (VDD) and a power-ground return (GND) since the reference planes are DC-isolated and AC short-circuited. The illustrated construction allows the most efficient package for power return and logic signals with the fewest number of conducting layers but has only limited noise immunity especially for higher frequency systems.

Figure 2:
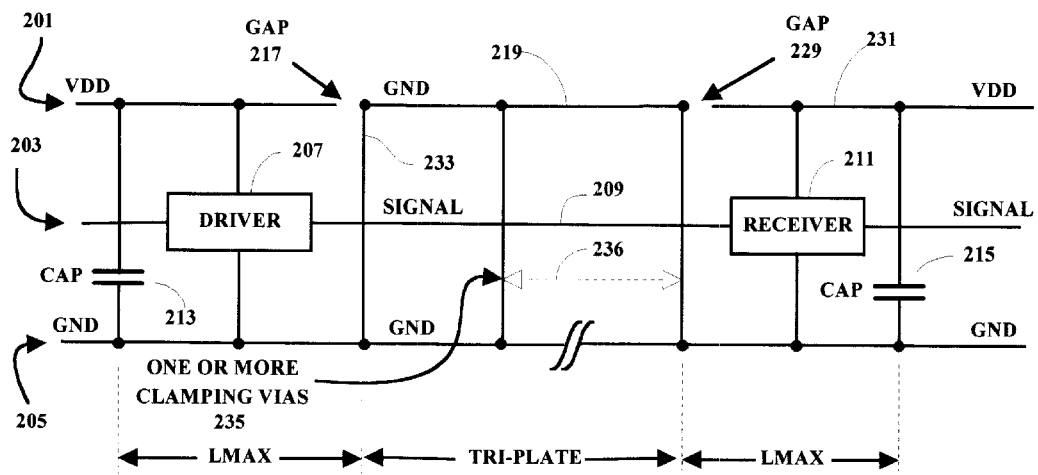
FIG. 2 is a schematic diagram of an exemplary circuit board signal transmission system tri-plate construction in which signal lines are positioned between GND planes which are short-circuited together through vias.

An exemplary embodiment of the present invention is illustrated in FIG. 2. As shown, there are three layers or planes arranged within a circuit board. The board construction includes a first outer layer or plane 201, a middle or signal layer or plane 203 and a second outer layer or plane 205. The first layer 201 includes adjacent defined areas of different potential, separated by gaps, e.g. 217 and 229 as shown, rather than having the entire planar surface held at a single potential as in prior art arrangements. The exemplary system further includes a driver 207, which is shown connected to a receiver 211 through signal line 209. The driver 207 is coupled to a VDD power plane area of the first plane 201 and is also coupled to a ground reference plane area on the third planar surface 205. The driver 207 and receiver 211 are located within different integrated circuits or chips mounted on a circuit board.

As further illustrated, a driver-related coupling capacitor 213 is connected between the VDD and GND planes at the location of the driver 207, and a receiver-related coupling capacitor 215 is connected between VDD and GND at the location of the receiver 211. In the illustrated embodiment, defined gaps such as gaps 217 and 229 are created in the upper plane surface 201 in order to define separate areas for VDD and GND potential connections on the same plane level of a circuit board. Although only three gaps are illustrated, it is understood that the gaps may be created along the entire plane to separate alternate areas, such as 219 and 231, of different potentials in order to provide areas of VDD and GND potential on the same board layer or plane for circuit connections. The illustrated construction also creates a tri-plate structure in which the signal line 209 is shielded or covered on the top and bottom sides of the signal line by conducting or shielding layers 219 and 205 within a circuit board, and the shielding layers are held at the same potential. This construction provides significantly enhanced signal isolation for the signals being transmitted along the signal line 209.

In the illustrated example, the ground plane 205 is continuous and does not include the gap design as does the first plane 201, although such a gapped-construction in the third plane 205 could also be implemented in accordance with the present invention. As shown in the exemplary embodiment, the ground plane 205 is directly connected to all of the ground areas GND of the first layer 201, such as 219, through vias, such as vias 233. Further, additional clamping vias 235 are provided along the transmission line section 236 between the driver 207 and the receiver 211 as needed to insure reference potential integrity and signal isolation.

As illustrated, the present invention defines the use of driver-specific and receiver-specific de-coupling capacitors at the driver 207 and at the receiver 211, respectively. Defined gaps e.g. 217 and 229, are also provided to separate VDD power areas e.g. 231, from GND areas e.g. 219 on the surface of the top or first outer layer 201.

In the illustrated exemplary embodiment, the various parameters and relationships implemented are defined as follows:

$LMAX < LAMBDA/20.$ $LAMBDA = (v/\text{Baudrate})/n.$

V=velocity of light in a vacuum.
Baudrate=Data rate as physically measured between SIGNAL and GND.
n=the square root of the dielectric constant of the propagating medium.

The action of the sub-circuit formed by the capacitors 213 and 215, the gaps, e.g. 217, and the vias, within each LMAX section, blocks the switching energy and/or the VDD noise from entering the tri-plate GND-SIG-GND reference system. The capacitors are very low inductance de-coupling capacitor which provides the required AC short-circuit in the VDD-GND area. The combinations of the gaps and the vias isolate VDD to the region bounded by LMAX. This isolation enables the use of true tri-plate construction as shown. Containing these elements within LMAX distance of each other is required to keep the elements in the same reference plane in a microwave sense through the fifth harmonic.

For example, if v=30 cm/ns, n=1.7 for PTFE material, and Baudrate=1 Gbit/s, then LAMBDA=18 cm and LMAX=0.9 cm. For Baudrate=2 Gbit/s, LMAX=0.45 cm. Since most chip/package combinations have on-package signal wires longer that 2 cm, this means that at 450 MHz and above, this invention separates power and high speed systems at the chip and package level. For card, board, backplane and unit level, the power system and the logic system remain separate. Power may thus be advantageously treated as truly a low speed KHz rate system without logic-injected high frequency components. Logic signal transmission may thus use advantageously clean and simple tri-plate without the need for DC-isolated reference planes.

Thus, each driver and each receiver is surrounded with its own capacitor, gap and via as shown, to form a module. The included components in each module block the switching energy and/or VDD noise from entering the tri-plate GND-GND reference system as hereinbefore noted. The capacitors have a very low series inductance and supply the charge needed for the driver or receiver to properly function. In the example, the capacitors are of the type normally found on chips and packages and provide inductance levels that are much lower than can be attained on a card or a board. The gaps block the tri-plate transmission system from residual noise that the capacitors still allow to exist on VDD. The vias (may be many vias in parallel along the open-circuit gaps as long as all are within the region LMAX) reduces the noise that gets past the gaps by providing a complementary short-circuit.

In accordance with the present invention, a driver or receiver module includes the driver or receiver together with a corresponding module capacitor (CAP), gap (GAP) and via (VIA), all within a distance defined as LMAX of each other. In the example, LMAX is 1/10 of the quarter wavelength of the fundamental frequency derived by a continuously alternating (i.e. " . . . 1010101 . . . ") logic signal string. This assures that frequencies up to and including the fifth harmonic of that string, that the GAP, CAP and VIA are all in the same reference plane in the microwave sense. This means that all of the module components are sufficiently close that they all see each other as the opens, shorts and capacitors that they really are without the impedance transformation that a quarter-wave or more of mutual separation would produce.

Figure 3:
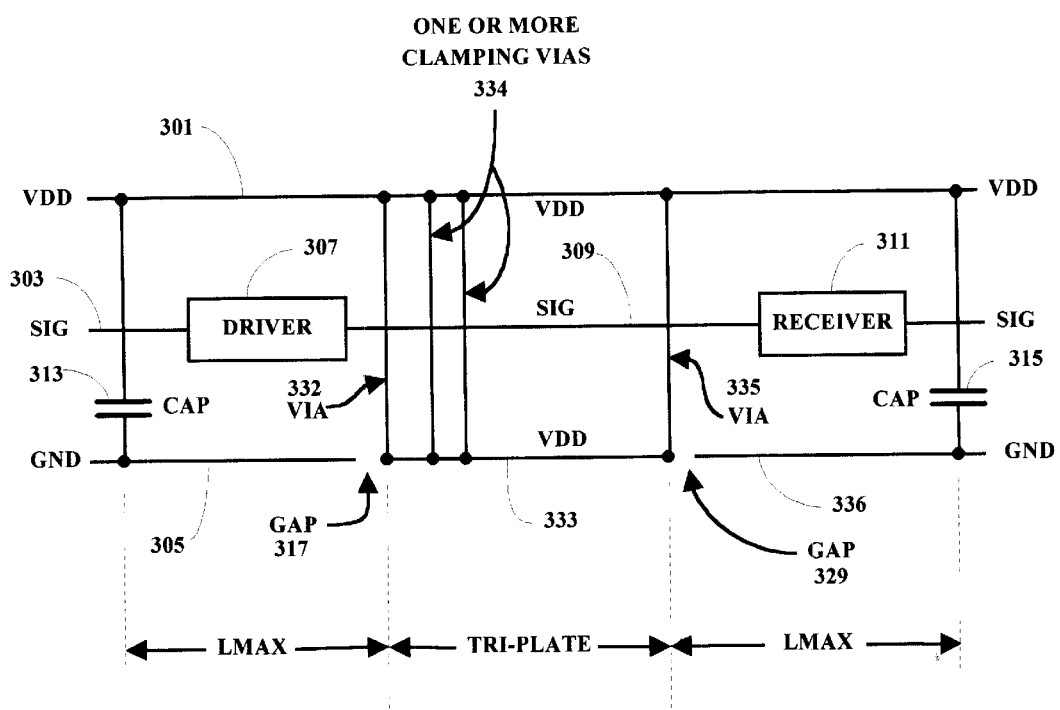
FIG. 3 is another example showing a related transmission system tri-plate construction in which signal lines are positioned between power planes which are short-circuited together through vias.

In a related construction, FIG. 3 shows a circuit similar to that shown in FIG. 2 except the shielding planes above and below the SIG line are both held at VDD potential rather than GND. As illustrated, a first outer plane 301 is held at VDD potential and a second outer plane 305 is connected at one end to GND. In FIG. 3, the second outer layer or plane 305 includes gaps such as 317 and 319 to separate GND from areas which are held at a power potential, such as VDD. A signal (SIG) layer or plane 303 is connected to a driver 307 which, in turn, is connected to a receiver 311 through a signal transmission line 309. The driver and receiver circuits are within different integrated circuits or chips mounted on the same circuit board in the example. A driver-related capacitor 313, and a receiver-related capacitor 315 are connected between VDD and GND in proximity to the driver 307 and the receiver 311, respectively, as shown. The section 333 of the lower plane which is isolated by gaps 317 and 329 is connected through via 332 to the VDD potential. Further, additional clamping vias 334 are added to connect section 333 to VDD along the signal transmission length 309 within the tri-plate area of the illustrated construction. In FIG. 3, LMAX sections and a tri-plate area are defined to enhance signal noise immunity for signals being transmitted between the driver 307 and the receiver 311. As shown, the signal line 309 is shielded at the top and bottom planes 301 and 333 within a circuit board tri-plate section, and the shielding planes are held at a like potential, which in the FIG. 3 example, is the VDD potential.

The illustrated construction addresses the problem of scalability to higher operating frequencies for packaging technologies for digital computers, including system boards and backplanes, processor boards, system I/O boards and adapter cards. In accordance with the disclosed construction, multiple logic signal (SIG) transmission lines are positioned between a pair of like-potential reference planes to form a tri-plate structure for transmitting logic signals from a driver to one or more receivers. With the construction shown, de-coupling capacitors along the length of the transmission line section are not required since both planes are at the same potential. Further, direct short-circuit connections are implemented with vias to insure reference voltage integrity along the length of the signal line within the tri-plate area. The high series inductance of the three part combination of via-component-via of de-coupling capacitors is replaced with the much lower inductance of one or more short-circuit connections through clamping vias. Each of the clamping vias is effective to much higher frequencies at clamping the voltage references together in the tri-plate section than the via-de-coupling component-via series combination because the de-coupling component for cards and boards is not appreciably less than 1 nano-henry, but the vias can be made arbitrarily large and short so that their inductance can be much smaller than one nano-henry.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A circuit board construction comprising:

a signal substrate layer arranged for having components mounted thereon;

at least one group of signal conductors on said signal substrate layer arranged to be connected between terminals of said components;

a first outer substrate layer positioned on a first side of said signal substrate layer; and a second outer substrate layer positioned on a second side of said signal substrate layer, said first outer substrate layer comprising a continuous conductive surface, said second outer substrate layer comprising a plurality of conductive areas, said conductive areas being electrically separate from each other, said circuit board construction further including a plurality of clamping vias connecting predetermined ones of said conductive areas on said second outer substrate layer with said continuous conductive surface of said first outer substrate layer in a manner such that said signal conductors between said components are positioned between conductive areas which are connected to a like potential.

2. The circuit board construction as set forth in claim 1 wherein said first and second outer substrate layers are co-extensive with said signal substrate layer between components mounted on said signal substrate layer.

3. The circuit board construction as set forth in claim 1 wherein said continuous conductive surface of said first outer substrate layer is arranged for connection to ground potential.

4. The circuit board construction as set forth in claim 1 wherein said continuous conductive surface of said first outer substrate layer is arranged for connection to a supply potential.

5. The circuit board construction as set forth in claim 2 wherein said continuous conductive surface of said first outer substrate layer is arranged for connection to ground potential.

6. The circuit board construction as set forth in claim 2 wherein said continuous conductive surface of said first outer substrate layer is arranged for connection to a supply potential.

7. The circuit board construction as set forth in claim 1 wherein said components comprise integrated circuit packages, said signal conductors being arranged for conducting data signals between driver and receiver circuits within different ones of said integrated circuit packages.

8. The circuit board construction as set forth in claim 7 wherein each of said driver and receiver circuits has an associated coupling capacitor mounted in proximity thereto, each of said coupling capacitors being arranged to provide an AC short-circuit connection between conductive areas of different potential in said first and second outer substrate layers in proximity to respective ones of said driver and receiver circuits.

9. The circuit board construction as set forth in claim 8 wherein each of said coupling capacitors is arranged for connection between supply potential and ground potential areas on said first and second outer substrate layers within a predetermined maximum distance from associated driver and receiver circuits.

10. The circuit board construction as set forth in claim 9 wherein said predetermined maximum distance is determined in relation to a data rate of said data signals.

11. The circuit board construction as set forth in claim 10 wherein said predetermined maximum distance is further determined in relation to a dielectric constant of a propagating medium through which said data signals are transmitted.

* * * * *